United States Patent [19]

Raciti et al.

[11] Patent Number: 5,132,866
[45] Date of Patent: Jul. 21, 1992

[54] DEVICE FOR PROTECTION AGAINST THE FORMATION OF PARASITIC TRANSISTORS IN AN INTEGRATED CIRCUIT FOR DRIVING AN INDUCTIVE LOAD

[75] Inventors: Salvatore Raciti; Sergio Palara, both of Catania, Italy

[73] Assignee: SGS-Thomson Microelectronics, s.r.l., Milan, Italy

[21] Appl. No.: 553,455

[22] Filed: Jul. 17, 1990

[30] Foreign Application Priority Data

Jul. 25, 1989 [IT] Italy .................. 21295 A/89

[51] Int. Cl.[5] ............................................. H02H 9/04
[52] U.S. Cl. ................................... 361/56; 361/91; 357/48; 307/303
[58] Field of Search ............. 307/254, 303, 542, 300, 307/270; 357/48, 86, 35, 47; 361/91, 88, 90, 18, 56, 111; 323/284

[56] References Cited

U.S. PATENT DOCUMENTS

| 3,931,634 | 1/1976 | Knight | 357/86 |
|---|---|---|---|
| 4,466,011 | 8/1984 | Van Zanten | 357/86 |
| 4,679,112 | 7/1987 | Craig | 361/91 |
| 4,775,912 | 10/1988 | Menniti et al. | 361/91 |
| 4,845,420 | 7/1989 | Oshizawa | 323/284 |
| 4,949,212 | 8/1990 | Lenz et al. | 361/56 |
| 5,051,612 | 9/1991 | Agiman | 357/47 |

Primary Examiner—A. D. Pellinen
Assistant Examiner—C. Schultz
Attorney, Agent, or Firm—Griffin, Branigan & Butler

[57] ABSTRACT

A monolithic integrated circuit (M) includes a power device (Q3, Q4) for driving an inductive load (L) and a control device for the power device. The control device comprises a voltage limiting circuit which includes a first transistor (Q2) responsive to negative impulses of the supply voltage and a second transistor (Q5) which is controlled by the first transistor for controlling re-firing of the power device in case of a negative pulse of the power voltage during a quenching period of the power device. The monolithic integrated circuit includes a substrate (5) having a substrate surface forming a supply voltage terminal of the power device and having a substrate voltage. An annular pocket (40) is formed in the substrate to surround or at least partially contain at least the first transistor (Q2) of the voltage limiting circuit. According to differing modes of the invention, the annular pocket (40) is biased at a voltage depending on that of the supply voltage terminal of the power device; is left at a floating potential. In one embodiment a pocket (3) is surrounded by an area of a different conductivity type (70) which has a grounded contact distributed along an emerging portion thereof.

6 Claims, 3 Drawing Sheets

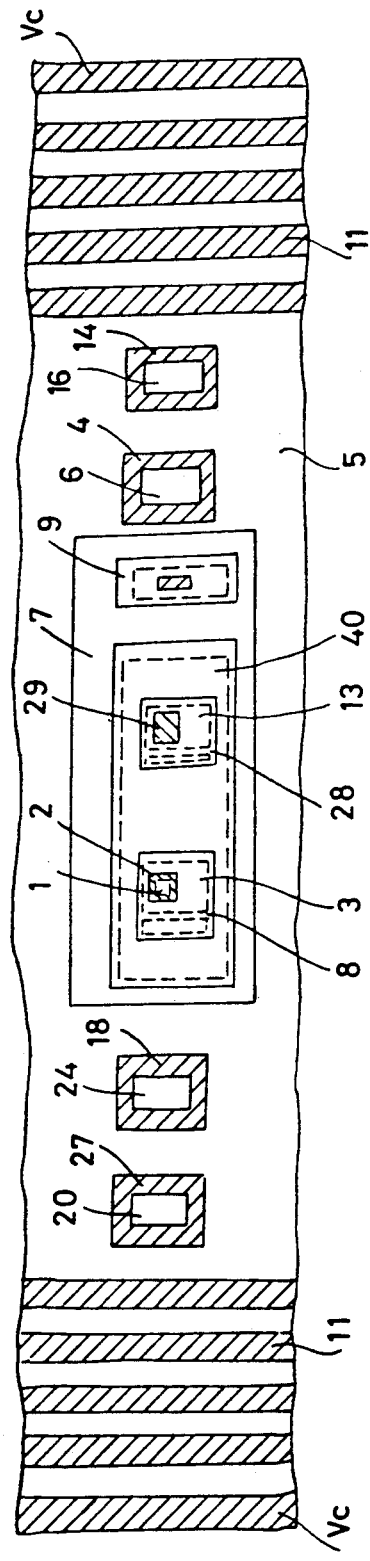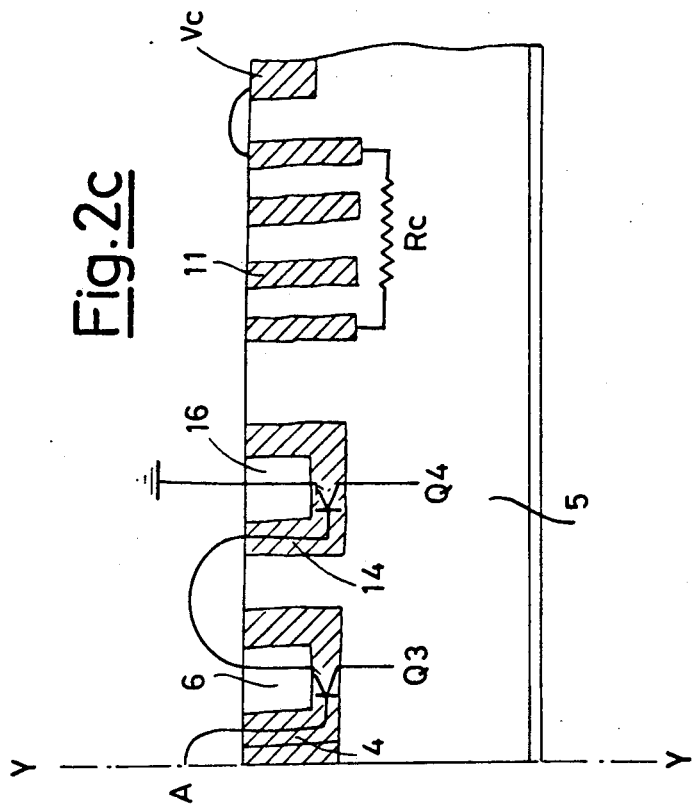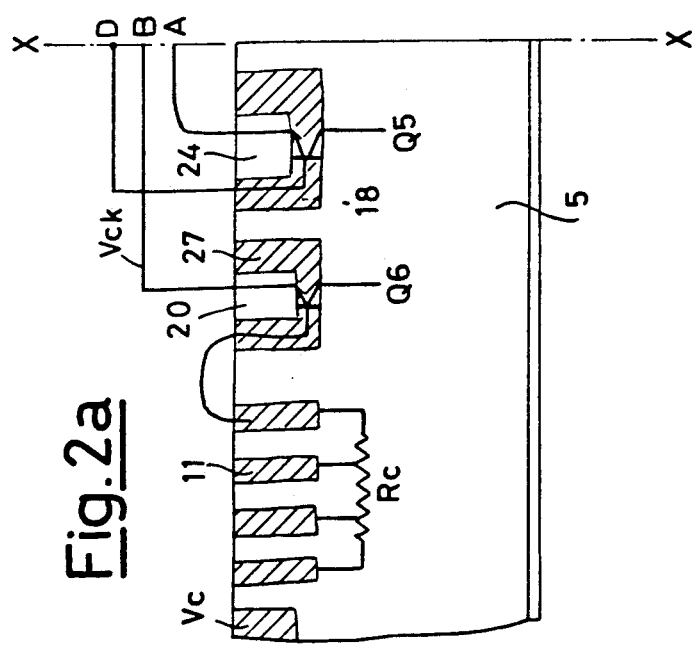

DEVICE FOR PROTECTION AGAINST THE FORMATION OF PARASITIC TRANSISTORS IN AN INTEGRATED CIRCUIT FOR DRIVING AN INDUCTIVE LOAD

BACKGROUND

1. Field of the Invention

The present invention relates to a device for protection against the parasitic effects caused by negative impulses of power supply voltages in monolithic integrated circuits including an inductive load, a power device for driving the inductive load and a control device for the power device.

2. Prior Art and Other Considerations

Circuit assemblies of this type are known, in particular for motor car use, which can be accomplished alternatively on two or one slabs.

In the case in which the power device and the control device are integrated on two different slabs a classic solution for protecting the power device from negative impulses of the power supply voltage consists in using an external resistance and a diode connected to the power supply and in parallel to the control device, respectively. The diode operates so that the negative voltage across the control device is not higher than its direct conduction voltage; the external resistance is used to limit the maximum current which can flow through the diode. If the diode and the external resistance are of the correct size, the solution is sufficient to prevent drawbacks such as excessive conduction, and on occasion the burning out of components internal to the integrated circuit.

But if it is desired to integrate the power device monolithically with the control device, the described protection is not sufficient.

In fact, with this technological solution, there is the formation of a parasite transistor having the collector connected to the collector of the power device and the emitter connected to the power supply.

When a negative impulse arrives on the power supply, the power device (say, of the darlington type) is quenched with a negative base tension, thus very quickly.

If the negative impulse arrives during the interval in which the power device is fired, that is when the coil on the collector of the power device has energy stored, the collector voltage of the same rises suddenly to a clamp voltage which, for example, can be set by a high-voltage zener diode whose cathode is connected to the collector of the power device.

This condition translates into an inverse secondary breakdown stress for the power device, whose quenching speed is much greater than in the case of a normal operation, when the darlington base can only be quenched to ground, while in the case examined it is quenched to a negative voltage. There is simultaneously present a direct secondary breakdown stress for the parasite transistor, which must withstand the high voltage of the power device and the current due to the fact that its base-emitter voltage is taken positive.

In order to avert such drawbacks, as shown in the simultaneous Pat. application No. 21150 A/89 filed on 11 Jul. 1989 in the name of the same applicant, the introduction is provided, inside the control device, of a voltage limiting circuit essentially constituted by a first transistor sensitive to negative impulses on the power supply and by a second transistor controlled by said first transistor and suitable for controlling the re-firing of the power device.

This solution, which in substance provides for the limitation of the collector voltage of the power device, is valid for solving the problem of negative overvoltages, and thus for preventing the destruction of the parasite transistor connected between the collector of the power device and the power supply; but due to the effect of the integrated structure, the formation is determined, between the base of said second control transistor and the power supply, of a further parasite transistor which adsorbs the current which should re-fire the power device and thus renders ineffective the solution described above.

The object of the present invention is to eliminate the effect of the further parasite transistor.

SUMMARY

According to the invention such object is attained with a device for protection against parasitic effects caused by negative impulses of power supply voltages in monolithic integrated circuits including a power device for driving an inductive load and a control device for the power device. The control device comprises a voltage limiting circuit constituted by a first transistor sensitive to negative impulses of the supply voltage and by a second transistor controlled by said first transistor and suitable for controlling the re-firing of the power device, characterized in that it comprises shielding element of the voltage limiter against the negative impulses of the power supply voltage.

In this way the further parasite transistor(s) which are formed between the components of the voltage limiter and the power supply are put into the position of not producing negative effects on the occasion of negative impulses of the power supply voltage. Their conduction is in fact prevented and with it their disturbance action on the voltage limiter.

BRIEF DESCRIPTION OF THE DRAWINGS

These and other features shall be made more evident by the following detailed description of a few embodiments illustrated as a non-limiting example in the enclosed drawings, wherein:

FIGS. 2a, 2b, 2c, to be intended as being united in a single figure along the lines X—X and V—V show an axial cross-sectional view of the above circuit assembly in the monolithic integrated technology;

FIG. 3 shows the same circuit assembly in the monolithic integrated technology, in a plan view from above;

DETAILED DESCRIPTION OF THE DRAWINGS

Figure 1:
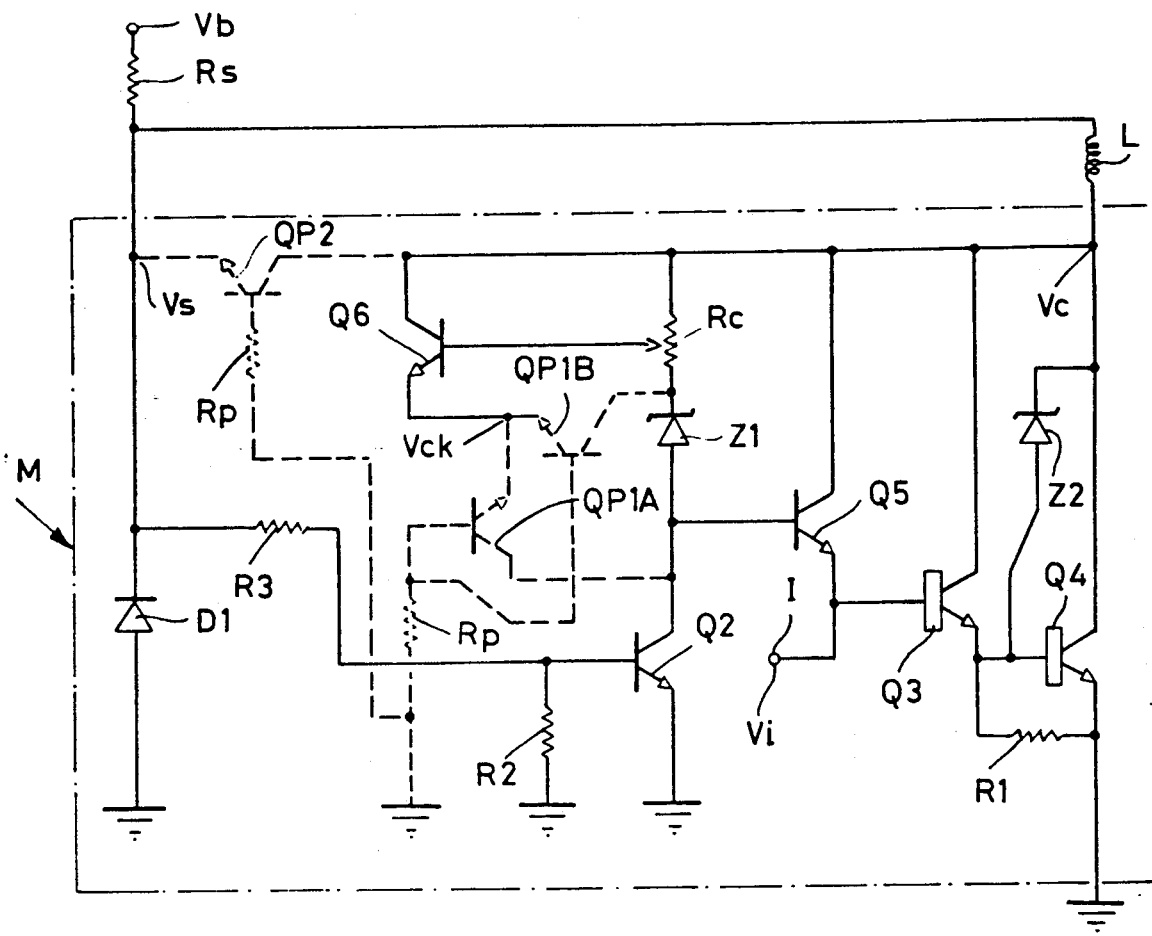
FIG. 1 shows the complete diagram of a circuit assembly consisting of a power device operating on an inductive load, a control device for the power device and a protection device according to the invention.

With reference to FIG. 1, there is shown a circuit assembly which comprises a load L, of the inductive type, driven by a power device formed by two transistors, Q3, Q4, in a darlington configuration with a common collector connected to a circuit node at a voltage Vc from load L. Transistor Q4 has the emitter connected to ground and the base connected to the emitter of transistor Q3. Between the base and the emitter of transistor Q4 there is a resistor R1, between the base and the collector of transistor Q4 there is a zener Z2. The base of transistor Q3 is connected on one side to an input I for a control signal Vi, while the other is controlled by a control device which comprises a transistor Q5, whose emitter is connected to the base of transistor Q3, while the collector is connected to the node at a voltage Vc and the base is connected on one side to the node at a voltage Vc through a zener Z1 and a potentiometer Rc, on the other side to the collector of a transistor Q2 controlling said transistor Q5. The emitter of transistor Q2 is grounded while the base is grounded through a resistor R2 and it is also connected to a power supply node at a voltage Vs through a resistor R3. The above node at a voltage Vs is in turn connected to ground through a diode D1 and to a supply voltage Vb, for example, the voltage of a motor vehicle's battery, through a resistor Rs. A transistor Q6 with a buffer function has the collector connected to node Vc, the base connected to the central terminal of potentiometer Rc and the emitter suitable for giving a bias voltage Vck for the purposes which shall be described later.

Due to the described structure the circuit operates as follows.

Let us suppose that the power device Q3, Q4 is in conduction and thus the inductor L is in the charging stage. In such a situation any negative impulse on the power supply Vb, and thus Vs, determines the quenching of power device Q3, Q4 with a negative base voltage of transistor Q3, and thus with a very high quenching speed. At the same time, the voltage Vc at the common collector rises up to a clamp voltage set by zener diode Z2. There could thus be produced an inverse secondary breakdown stress of the power device Q3, Q4 which is, however, prevented by the voltage limiter constituted by transistors Q2 and Q5, by resistor Rc and by zener Z1. In fact, in this situation, transistor Q2 is quenched, as its base is kept at a negative potential by voltage Vs, and the positive overvoltage Vc on load L fires transistor Q5, which returns the power darlington Q3, Q4 to conduction, which discharges the positive overvoltage to ground.

Figure 2B:
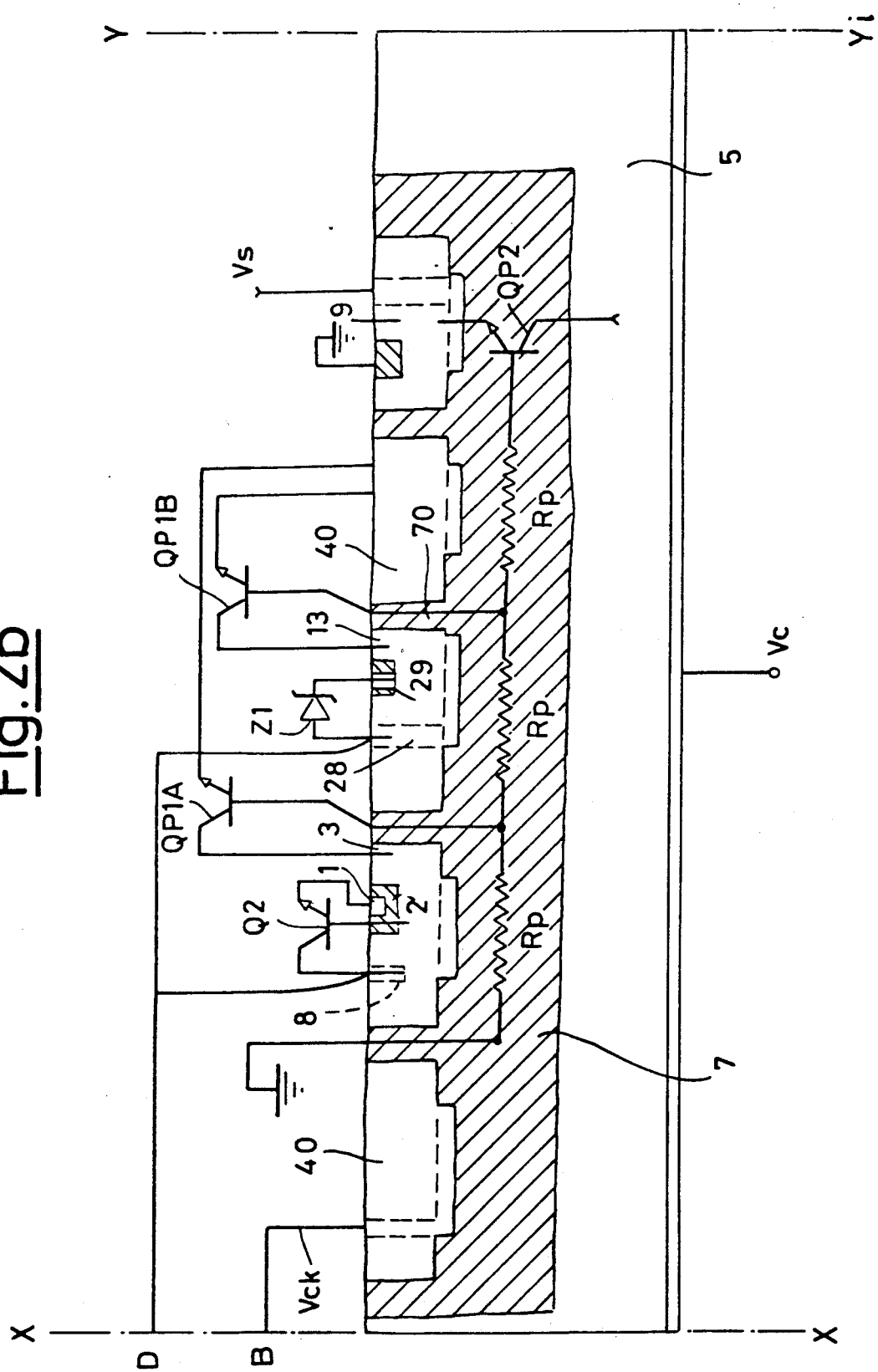

FIGS. 2a, 2b, 2c show the accomplishment of the circuit assembly of FIG. 1 in the form of a monolithic integrated circuit (M block in FIG. 1). In particular FIG. 2c shows the power device formed by the two transistors Q3, Q4 whose bases are accomplished internally to the doped p-type regions 4, 14, while the emitters are accomplished in the doped n-type regions 6, 16 and the common collector is accomplished in an n-type region or substrate 5. FIG. 2a and 2b in turn show the control device, wherein transistor Q2 has the base constituted by a doped p-type region 2, the emitter constituted by an doped n-type region 1, and the collector constituted by a region 8 of the doped n+ type. To the collector of transistor Q2, region 8, there is connected (points D of FIGS. 2a and 2b) the base of transistor Q5, obtained internally to a p-type region 18. The collector of transistor Q5 is connected to an n-type region 5; the emitter, obtained internally to an n-type region 24, is connected (points A of FIGS. 2a and 2b) to the base of transistor Q3. At the base of transistor Q5, region 18, there is connected (points D) at one end zener Z1 which is opposite region 28 of the type n+, while the other end, opposite region 29 of type p, there is connected to the resistance divider Rc, in turn obtained in a p-type region 11 connected to the node at voltage Vc.

The accomplishment in the form of an integrated circuit determines the formation of a parasite transistor QP2, illustrated with dotted lines in FIG. 1, whose base is formed by a p-type region 7 also including a series of resistors Rp and in its turn connected to ground, while the collector is formed by the common collector of the power device Q3, Q4, region 5, and the emitter is formed by a region 9 of the type n+ in its turn connected to the power supply Vs.

The presence of such transistor QP2 has made it necessary to introduce the control device with voltage limiter Q2, Q5, Z1, Rc. It is in fact necessary to have the presence of a control device suitable for reducing any positive overvoltages Vc, which by combining with negative impulses on the power supply Vs might cause overcurrents inside the parasite transistor with the consequent destruction of the same.

In addition, the monolithic accomplishment of the integrated circuit provides for the formation of a pair of parasite transistors QP1A, QP1B, (illustrated in FIG. 1 with dotted lines), whose bases are formed by emerging sections 70 of region 7. The collector of QP1A is constituted by the n-type region 3 and is thus connected to the base of transistor Q5. The collector of transistor QP1B is constituted by an n-type region 13 and is thus connected between zener Z1 and resistance divider Rc. Such parasite transistors QP1A and QP1B can, by their conduction, prevent the firing of transistor Q5 and thus the re-firing of power device Q3, Q4 in the presence of negative overvoltages Vs and of positive overvoltages Vc.

To avert such a drawback a bias pocket 40 has been introduced according to the invention, to which there are connected the emitters of the parasite transistors QP1A, QP1B. Such pocket 40 has the effect of reducing to a minimum the currents through parasite transistors QP1A, QP1B and thus allow the re-firing of the power darlington Q3, Q4, when it proves necessary to discharge negative positive overvoltages Vc.

The biasing of pocket 40 is that which ensures protection. Three types of bias may be selected:

a) to bias pocket 40 with a voltage which does not depend on Vs (supply voltage of the integrated circuit). A non-limiting example of how to bias the pocket (case a) is illustrated in FIG. 2a wherein the pocket is biased at a voltage Vck, which depends on the collector voltage of the output darlington.

The emitters of QP1A, QP1B are constituted by an n-type annular region 40 and subsequently connected (points B of FIG. 2a and 2b) to the emitter of transistor Q6, whose base is formed by a p-type region 27, in turn connected to the resistance divider Rc, while the collector is connected to region 5 and the emitter is formed by an n-type region 20 and supplies potential Vck to region 40 of FIG. 2b.

In this case QP1A, QP1B will not be able to re-fire on their own because in the condition described their Vbe will certainly be negative; in fact, their base is grounded and their emitter is at a certainly positive voltage because it depends on the voltage Vc of the output darlington Q3, Q4, which is compelled to rise, since Q3, Q4 is quenched while inductance L was charged.

Transistor Q6 can be avoided if the current required for the biasing of the n-type annular area 40 is not such as to cause a voltage drop across resistance Rc higher than a few volts. On the other hand it can become a darlington if the current reduction given by the gain of a transistor is not sufficient.

It will naturally be necessary to protect in a similar manner all other components forming part of the circuit accomplishing the protection.

FIGS. 2a and 2b show an embodiment of the protection of Q2 and Z1.

b) to bias the pocket at the same voltage as the insulation, layer 7 of FIG. 2b.

In this case transistors QP1A, QP1B cannot be fired because their base and their emitter are at the same potential (ground in the case of FIG. 2b).

c) To leave the pocket unbiased (floating). Transistors QP1A, QP1B are shielded for two reasons:

Lower gain because they have a wider base (presence of the floating pocket);

they have a higher base resistance because the presence of the floating pocket throttles the p-type region which represents their base (Layer 7 of FIG. 2b).

Figure 4:
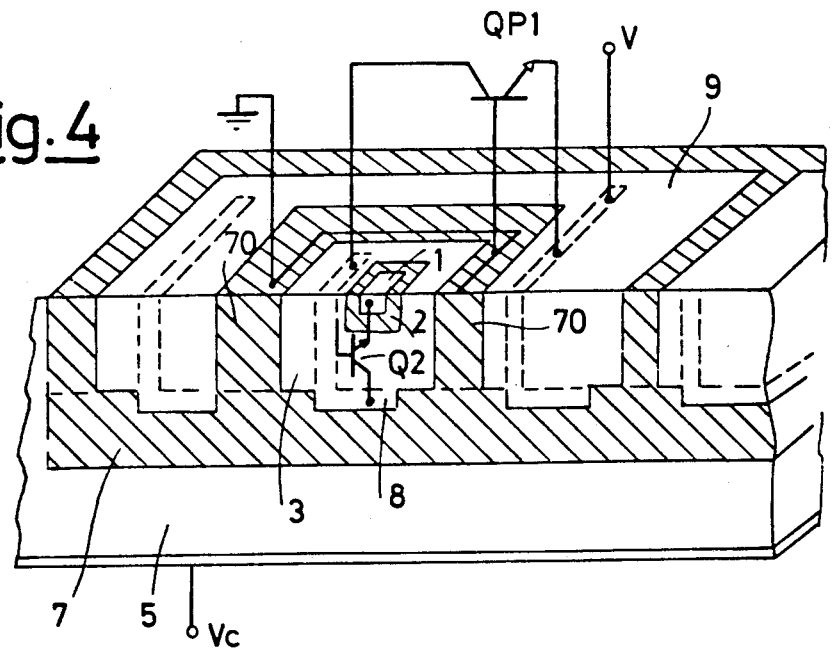
FIG. 4 is a partially-sectioned variant of the FIG. 2b.

FIG. 4 shows a further way for accomplishing the protection; in it only the protection of Q2 is shown for the sake of simplicity and thus we will talk of only one NPN parasite lateral transistor QP1.

In this case the shielding of the active components (Q2 in the case in the figure) is accomplished by moving the critical pockets away, that is those whose epitaxial layer n (for example, Layer 9 of FIG. 4) is biased at voltages which depend on Vs, the supply voltage of the integrated circuit (FIG. 1), on the pockets which contain the active components (for example, layer 3 for transistor Q2 in the case of FIG. 4). This is obtained by providing a suitable size to the emerging areas 70 of region 7 of FIG. 4.

In this way the gain of the NPN parasite lateral transistor QP1 of FIG. 4 is reduced since its base, which is constituted by area 70 of FIG. 4, is widened, given that the distance between a pocket of n-type conductivity (layer 3) and the adjacent one (layer 7) increases.

In this case, however, it is necessary to insert some contacts on the emerging area of the p-type conductivity (layer 70 of FIG. 4) which surrounds the pockets of active components which provide the protection (layer 3 of FIG. 4) and which separate them from the adjacent pockets (layer 9 of FIG. 4); in this way, in fact, the areas 70 which form the base of QP1 at the same voltage of the insulation (layers 7 and 70 of FIG. 4) are biased and the fact that any currents dispersed towards the insulation may become base currents for QP1 is avoided.

The passages of the metal connecting tracks between the active elements contained in the n-type pockets (3), surrounded by the p-type areas (70), and the outside, remain possibly excluded.

We claim:

1. A monolithic integrated circuit including a power device for driving an inductive load and a control device for said power device, said control device comprising a voltage limiting circuit essentially constituted by a first transistor responsive to negative pulses of a supply voltage and by a second transistor controlled by said first transistor for controlling re-firing of the power device in case of a negative pulse of the supply voltage during a quenching period of the power device, said monolithic integrated circuit including a substrate having a substrate surface forming a supply voltage terminal of said power device and having a substrate voltage, doped regions defined in the substrate to from active and passive components of the power device and the control device and a pocket formed in the substrate to surround at least said first transistor of the voltage limiting circuit of the control device, said pocket being biased at a voltage depending on that of said supply voltage terminal of the power device.

2. The circuit of claim 1, wherein the pocket is an annular pocket.

3. A monolithic integrated circuit including a power device for driving an inductive load and a control device for said power device, said control device comprising a voltage limiting circuit essentially constituted by a first transistor responsive to negative pulses of a supply voltage and by a second transistor controlled by said first transistor for controlling re-firing of the power device in case of negative pulse of the supply voltage during a quenching period of the power device, said monolithic integrated circuit including a substrate having a substrate surface forming a supply voltage terminal of said power device and having a substrate voltage, doped regions defined in the substrate to form active and passive components of the power device and the control device and a pocket formed in the substrate to surround at least said first transistor of the voltage limiting circuit of the control device, said pocket being left at a floating potential.

4. The circuit of claim 3, wherein the pocket is an annular pocket.

5. A monolithic integrated circuit including a power device for driving an inductive load and a control device for said power device, said control device comprising a voltage limiting circuit essentially constituted by a first transistor responsive to negative pulses of a supply voltage and by a second transistor controlled by said first transistor for controlling re-firing of the power device in case of a negative pulse of the supply voltage during a quenching period of the power device, said monolithic integrated circuit including a substrate having a substrate surface forming a supply voltage terminal of said power device and having a substrate voltage, doped regions defined in the substrate to form active and passive components of the power device and the control device and a pocket formed in the substrate to contain therein at least a portion of at least said first transistor of the voltage limiting circuit of the control device, said pocket being surrounded by an area of different conductivity type which has a grounded contact distributed along an emerging portion thereof.

6. The circuit of claim 5, wherein the pocket is an annular pocket.

* * * * *